United States Patent [19]

Okubo et al.

[11] Patent Number: 4,797,647

[45] Date of Patent: Jan. 10, 1989

[54] INDUCTOR AND A MANUFACTURING METHOD THEREFOR

[75] Inventors: Akira Okubo, Takefu; Kenichi Sasaki, Imadate, both of Japan

[73] Assignee: Murata Manufacturing Co., Ltd., Nagokakyo, Japan

[21] Appl. No.: 152,797

[22] Filed: Feb. 5, 1988

[30] Foreign Application Priority Data

Feb. 6, 1987 [JP] Japan ................................. 62-16714

[51] Int. Cl.⁴ ...................... H01F 17/06; H01F 15/10; H01F 41/02
[52] U.S. Cl. .................................. 336/175; 29/602.1; 333/12; 336/192; 361/405
[58] Field of Search ............... 333/81 R, 12, 182, 243; 336/174, 175, 176, 192; 29/602 R, 606; 361/405, 306; 338/322

[56] References Cited

U.S. PATENT DOCUMENTS 2,754,486  7/1956  Hathorn ........................ 361/405 X
3,162,721  12/1964  Rayburn ....................... 361/405 X Primary Examiner—Thomas J. Kozma
Attorney, Agent, or Firm—Wenderoth, Lind and Ponack

[57] ABSTRACT

An inductor suitable for use as a noise filter and a method for manufacturing the inductor. The inductor comprises a combination of a U-like-shaped lead wire comprising a head and a pair of legs bent from both ends thereof and extending opposite to each other with tubular magnetic material cores insertably fixed to both the legs respectively, the lead wire forming between one ends of the magnetic material cores and the head exposed portions where parts of the lead wire are exposed, and at the legs at the other end sides of the cores arcuate portions which absorb impact applied to the lead wire respectively.

The manufacturing method for the inductor comprises the processes of inserting the magnetic material cores onto both legs of the lead wire, forming the arcuate portions at both the legs at the free end sides thereof respectively, dipping the lead wire into a liquid adhesive keeping the head of lead wire below, and taking-up the lead wire out of the liquid adhesive to dispose the cores to be retained by the arcuate portions and dry and cure the liquid adhesive to fix the cores to both the legs, the processes being carried out in the order; and forms the exposed portions at the legs between the head and the magnetic material cores, and arcuate portions at the legs at the free end sides thereof adjacent to the cores.

3 Claims, 3 Drawing Sheets

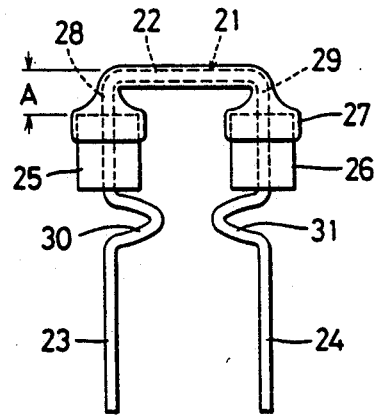
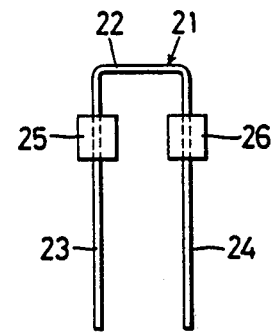
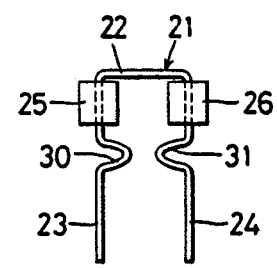
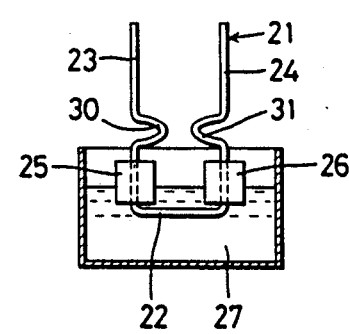
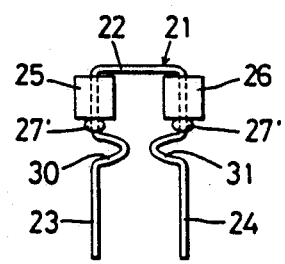
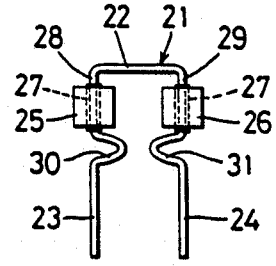
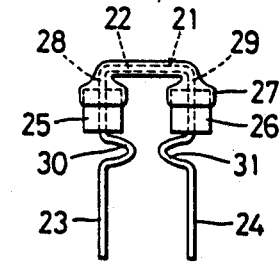

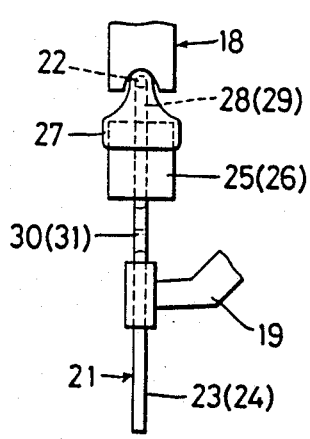
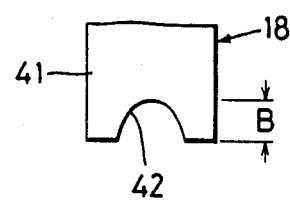
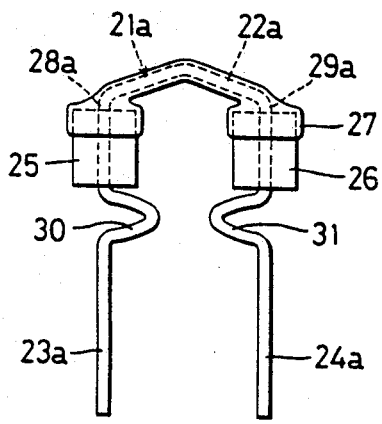
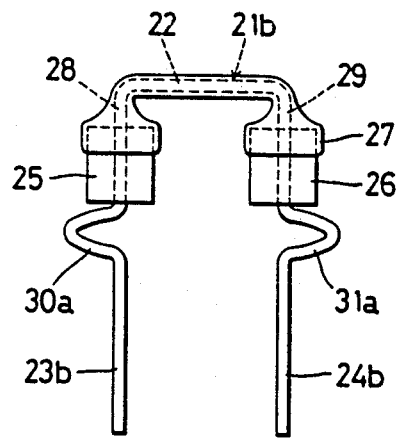
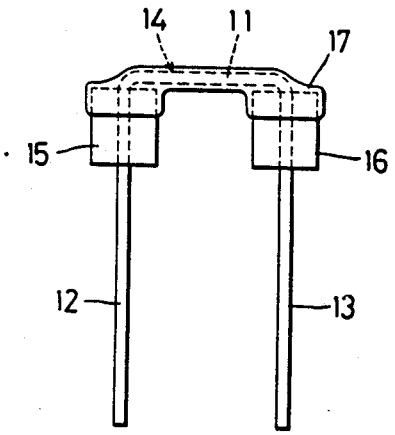

INDUCTOR AND A MANUFACTURING METHOD THEREFOR

BACKGROUND OF THE INVENTION

1. Field of the Invention

The present invention relates to an inductor suitable for use as, for example, a noise filter and a manufacturing method for the inductor.

2. Description of the Prior Art

Conventionally, this kind of inductor, for example as shown in FIG. 8, comprises a U-like-shaped lead wire 14 including a head 11 and a pair of legs 12 and 13 bent from both lengthwise ends of the head 11 and extending substantially in parallel to each other in the same direction, and tubular magnetic material cores 15 and 16 (hereinafter referred to as the ferrite beads) inserted onto the both the legs 12 and 13 respectively, the ferrite beads 15 and 16 being insertably fixed thereto by an adhesive 17 in an epoxy resin series.

Such conventional inductor, for example as shown in FIGS. 9-(a) through -(c), is manufactured by the following processes of, (1) inserting the ferrite beads 15 and 16 onto both the legs 12 and 13 in continuation of the head of lead wire 14 (refer to FIG. 9-(a)), (2) dipping the lead wire 14 having the ferrite beads 15 and 16 inserted onto the legs 12 and 13 into a liquid adhesive 17' keeping the head 11 of the lead wire 14 below (refer to FIG. 9-(b)), and (3) taking up the lead wire 14 having the inserted ferrite beads 15 and 16 out of the liquid adhesive 17' and trying to cure the liquid adhesive 17' applied to the ferrite beads 15 and 16 and the lead wire 14 while keeping the head 11 thereof above so as to form an adhesive 17, by which the ferrite beads 15 and 16 are fixed to both the legs 12 and 13 of lead wire 14 respectively (refer to FIG. 9-(c)).

In a case where such inductor is automatically insertably mounted onto a printed substate or the like by an automatic insertion apparatus, as shown in FIG. 10, a push rod 18 of the automatic insertion apparatus presses the head 11 of lead wire 14 at the one end sides of ferrite beads 15 and 16 and simultaneously a chuck 19 of the same holds the lead wire 14 at the other end sides of ferrite beads 15 and 16, thereby inserting the inductor into the printed substrate.

The conventional inductor, as above-mentioned, is so constructed that the lead wire 14 having the ferrite beads 15 and 16 inserted onto the legs 12 and 13 is dipped into the liquid adhesive 17' while keeping the head 11 of lead wire 14 below and then is taken up from the liquid adhesive 17', so that the adhesive 17' is dried and cured to form the adhesive 17, whereby the ferrite beads 15 and 16 abut at one end faces thereof against the head 11 of lead wire 14 so as to be fixed thereto.

Hence, when the automatic insertion apparatus is used to automatically insert the inductor into the substrate, the ferrite beads 15 and 16 are nipped between the push rod 18 and the chuck 19, thereby creating inconvenience such that the ferrite beads 15 and 16 may be broken due to impact applied when the inductor is inserted.

OBJECTS OF THE INVENTION

In the light of the above problem, the present invention has been designed.

A first object thereof is to provide an inductor which has no fear that ferrite beads are broken when the inductor is inserted by an automatic insertion apparatus into a substrate.

A second object of the invention is to provide an inductor which avoids mechanical contact of the ferrite beads with the automatic insertion apparatus, thereby preventing a push rod or a chuck at the automatic insertion apparatus from wearing.

A third object of the invention is to provide an inductor which, when used as a noise filter, is obtainable always of a stable and desirable filter characteristic.

A fourth object of the invention is to provide an inductor which improves strength of legs at a lead wire and facilitates insertion thereof into a printed substrate or the like.

A fifth object of the invention is to provide a method which can simply and efficiently manufactures an inductor free from a breakdown at the ferrite beads when the inductor is inserted by the automatic insertion apparatus into the substrate.

The above and further objects and novel features of the invention will more fully appear from the following detailed description when the same is read in connection with the accompanying drawings.

BRIEF DESCRIPTION OF THE DRAWINGS

FIG. 1 is a front view of an embodiment of an inductor of the invention,

FIG. 2 is a view explanatory of a first embodiment of manufacturing processes for the inductor of the invention, FIG. 3 is a view explanatory of a second embodiment of the manufacturing processes for the inductor of the invention, FIG. 4 is an enlarged side view of the principal portion exemplary of mounting conditions for the inductor of the invention by the automatic insertion apparatus into a substrate.

FIG. 5 is an enlarged front view of the principal portion of a push rod at the automatic insertion apparatus, FIG. 6 is a front view of a modified embodiment of the inductor of the invention, FIG. 7 is a front view of another modified embodiment of the inductor of the invention, FIG. 8 is a front view showing the conventional inductor.

DETAILED DESCRIPTION OF THE INVENTION

Figure 9:
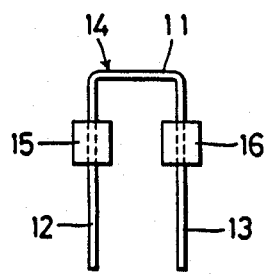
FIG. 9 is an illustration of the conventional inductor manufacturing processes.
Figure 9:
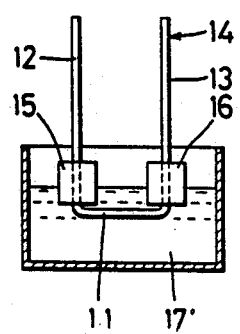
Figure 9:
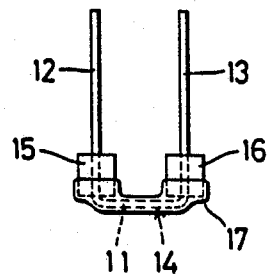
Figure 10:
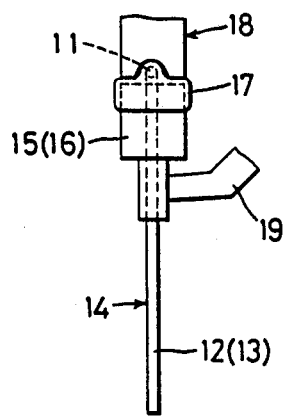
FIG. 10 is an enlarged side view of the principal portion of the conventional inductor in mounting condition.

FIG. 1 is a structural view of an inductor of the invention, in which a lead wire 21 comprises a head 22 and a pair of legs 23 and 24 extending from both lengthwise ends of the head 22 and opposite to each other and is U-like-shaped, and tubular ferrite beads 25 and 26 of magnetic material cores are insertably fixed onto both the legs 23 and 24 by use of an adhesive 27 of epoxy resin series.

The ferrite beads 25 and 26 are insertably mounted on the legs 23 and 24 in relation of forming between the one end faces of the ferrite beads 25 and 26 and the head 22 of the lead wire 21 exposed portions 28 and 29 each having a length A through which part of each leg 23 or 24 of the lead wire 21 is exposed, the length A being set 2 mm or more.

Also, arcuate portions 30 and 31 are molded at both the legs 23 and 24 at the sides of the other end faces of ferrite beads 25 and 26 respectively.

The ferrite beads 25 and 26 are insertably mounted onto both the legs 23 and 24 in relation of being retained by the arcuate portions 30a and 31 respectively.

In addition, the adhesive 27 used for fixing the ferrite beads 25 and 26 to both the legs 23 and 24 is also applied to the head 22 and exposed portions 28 and 29, thereby electrically insulating them.

Next, explanation will be given on a manufacturing method of the invention for the inductor of the above structure in accordance with illustrations of manufacturing processes shown in FIGS. 2-(a) through -(d).

Namely, the inductor of the invention is manufactured by the following processes in the order of;

(1) inserting the ferrite beads 25 and 26 onto both the legs 23 and 24 provided at both lengthwise ends of the head 22 at the U-like-shaped lead wire 21 respectively (refer to FIG. 2-(a)).

(2) disposing the ferrite beads 25 and 26 on the legs 23 and 24 at the head 21 side of the lead wire 21 and arcuately bending the legs 23 and 24 at the open end sides thereof to form the arcuate portions 30 and 31 (refer to FIG. 2-(b));

(3) dipping into a liquid adhesive 27' the lead wire 21, which has the ferrite beads 25 and 26 and forms the arcuate portion 30 and 31, while keeping the head 22 below (refer to FIG. 2-(c)); and (4) taking up the lead wire 21 out of the liquid adhesive 27' and turning over the same to keep the head 22 above to move the ferrite beads 25 and 26 toward the arcuate portion 30 and 31, thereby forming the exposed portions 28 and 29 between the ferrite beads 25 and 26 and the head 22 and disposing the ferrite beads 25 and 26 to be retained by the arcuate portions 30 and 31, so that in this state, the liquid adhesive 27' applied to the ferrite beads 25 and 26 and lead wire 21 is dried and cured to form and adhesive 27 by which the ferrite beads 25 and 26 are fixed to both the legs 23 and 24 respectively (refer to FIG. 2-(d)).

Alternatively, the following processes (3)' and (4)' as shown in FIGS. 3-(a) and -(b), may be used instead of those in FIGS. 2-(c) and -(d) for applying the adhesive to the ferrite beads 25 and 26 and lead wire 21:

(3)' disposing the ferrite beads 25 and 26 on both the legs 23 and 24 adjacently to the head 22 and applying the liquid adhesive 27' by a dispenser (not shown) or the like onto the legs 23 and 24 between the ferrite beads 25 and 26 and the arcuate portions 30 and 31 respectively (refer to FIG. 3-(a)); and (4)' moving the ferrite beads 25 and 26 until retained by the arcuate portions 30 and 31, so as to form the exposed portions 28 and 29 between the ferrite beads 25 and 26 and the head 22 and interpose the liquid adhesive 27' between the ferrite beads 25 and 26 and the lead wire 21, so that in this state, the adhesive 27' is dried and cured to form the adhesive 27, through which the ferrite beads 25 and 26 are fixed to both the legs 23 and 24 (refer to FIG. 3-(b)).

The inductor of the invention constructed as abovementioned is automatically inserted onto the substrate (not shown) or the like by use of the automatic insertion apparatus, for example as shown in FIG. 4, in such a manner that the push rod 18 presses the head 22 of lead wire 21 at the one end face side of each ferrite bead 25 or 26 and simultaneously the chuck 19 holds each leg 23 or 24 below each arcuate portion 30 and 31.

In this case, as enlarged in FIG. 5, when a head 41 of the push rod 18 is provided with a recess 42 of depth B smaller than a length A of the respective exposed portions 28 and 29, the head 41 does not contact with the respective ferrite beads 25 and 26 when the push rod 18 presses the head 22 of the lead wire 21.

In other words, since the depth B generally is 0 to 2 mm, A>B is obtained not to bring the head 41 of push rod 18 in contact with the respective ferrite beads 25 and 26.

Also, impact applied to the respective legs 23 and 24 when inserted into the printed substrate or the like is absorbed by each arcuate portion 30 and 31 and there is no fear that the ferrite beads 25 and 26 come into contact with the chuck 19.

Therefore, the respective ferrite beads 25 and 26 are not held in mechanical contact between the push rod 18 and the chuck 19, so that even when the automatic insertion apparatus is used to automatically insert the inductor into the printed substrate, mechanical contact is eliminated from between the magnetic material cores and the automatic insertion apparatus. As a result, there is no fear that the magnetic material cores may be broken due to impact caused when the inductor is inserted and that the push rod 18 and chuck 19 at the automatic insertion apparatus wear.

Also, since the magnetic core is prevented from breakdown, the inductor, when used as the noise filter, is obtainable of always stable and desirable filter characteristic.

Furthermore, the arcuate portions 30 and 31 formed at the lead wire 21 improve strength of the legs 23 and 24, thereby facilitating the insertion of inductor into the printed substrate or the like.

The inductor of the embodiment of the invention and the conventional inductor are used to be subjected to head hitting test under three conditions and assuming the automatic insertion so that the number of ferrite beads broken or chipped is compared, the result of which is shown in Table 1.

The head hitting test drops a weight of 100 g from the height of (a) 4 cm, (b) 6 cm, and (c) 8 cm onto the head of each inductor whose lead wire is inserted at both legs into the bores at the printed substrate so that the number of ferrite beads broken or chipped by impact caused at that time is measured.

Each ten specimens are used in the test.

TABLE 1

| Specimens | Condition (Dropping Height, Weight of 100 g) | | |
|---|---|---|---|
| | (a) 4 cm | (b) 6 cm | (c) 8 cm |
| A. Embodiment of Inductor of the Invention | 0 | 0 | 0 |
| B. Conventional Inductor | 0 | 1 | 3 |

As seen from Table 1, in the embodiment of the inductor of the invention (A), the ferrite beads are not at all broken under the respective conditions in comparison with the conventional one (B), FIG. 6 is a front view of a modified embodiment of the inductor of the invention.

The modified embodiment is the same in basic structure as the FIG. 1 embodiment, whereby the same components are designated with the same reference numerals and omitted of description, but only the difference between both the embodiments will be described.

Namely, in FIG. 6, a lead wire 21a is different in that a head 22a thereof is formed substantially in a triangle from the lead wire 21 in FIG. 1.

Also, in FIG. 6, reference numerals 23a and 24a designate legs of the lead wire 21a, and 28a and 29a designate exposed portions thereof respectively.

FIG. 7 is a front view of another modified embodiment of the inductor of the invention, which is the same in basic structure as the FIG. 1 embodiment, so that the components the same as those therein are designated by the same reference numerals and omitted of description, but only the difference between both the embodiments will be described.

In other words, in FIG. 7, a lead wire 21b is different from the FIG. 1 embodiment in that arcuate portions 30a and 31a each projecting at an angle of 180° in the reverse direction to those in the FIG. 1 embodiment.

In addition, the inductor of the invention is not limited to the above embodiments, but of course properly changeable within a scope wherein the principle of the invention is not changed.

For example, the length A of each exposed portion 28 or 29 formed at the lead wire 21 may be changed in a range of A>B corresponding to the depth B of the recess 42 at the head 41 of the push rod 18 at the automatic insertion apparatus.

Alternatively, the magnetic material core may be mounted on only either one of the legs.

In addition, even in a case of mounting one ferrite material core to one leg only, the arcuate portions are preferable to be formed on both the legs.

The inductor of the invention is not limited in use for the noise filter.

Although several embodiments have been described, they are merely exemplary of the invention and not to be constructed as limiting, the invention being defined solely by the appended claims.

We claim:

1. An inductor comprising a U-like-shaped lead wire provided at both lengthwise ends of a head with a pair of legs opposite to each and a magnetic material core insertably mounted on at least one of said legs, said inductor characterized in that an exposed portion is formed at said leg of said wire for part of said leg to be exposed between one end of said magnetic material core and said head of said lead wire and an arcuate portion is formed at said leg at the other end side of said magnetic material core.

2. An inductor as set forth in claim 1, wherein said magnetic material core is fixed to said leg by use of an electrically insulating adhesive and said head and exposed portion of said leg at said lead wire are covered with said adhesive.

3. An inductor manufacturing method characterized by sequentially performing the processes of;
   inserting a magnetic material core onto at least one of legs provided at both lengthwise ends of a head of a U-like-shaped lead wire;
   positioning said magnetic material core at a side of said head of said lead wire so as to form an arcuate portion at said leg at the open end side thereof;
   dipping into a liquid adhesive said lead wire, which is provided with said arcuate portion, while keeping said head of said lead wire below; and
   taking up said lead wire out of said liquid adhesive to turn over said lead wire, keep said head above, move said magnetic material core toward said arcuate portion to thereby formed an exposed portion at said leg between one end of said magnetic material core and said head, and retain said magnetic material core to said arcuate portion, so that in such state said liquid adhesive applied to said magnetic material core and lead wire is dried and cured, said cured adhesive fixing said magnetic material core to said leg at said lead wire.

* * * * *